United States Patent [19]

Hekimian

[11] 4,220,914

[45] Sep. 2, 1980

[54] AM-PM CONVERSION FOR MEASURING DELAY DISTORTION

[75] Inventor: Norris C. Hekimian, Rockville, Md.

[73] Assignee: Hekimian Laboratories, Inc., Rockville, Md.

[21] Appl. No.: 915,537

[22] Filed: Jun. 14, 1978

[51] Int. Cl.² .................... G01R 27/00; H04B 1/10
[52] U.S. Cl. ....................... 324/57 DE; 328/162; 328/166
[58] Field of Search ............ 324/57 DE, 57 R, 83 Q; 328/162, 166; 332/18, 37 R, 37 D, 39, 41; 325/67, 363, 473, 42, 52, 65

[56] References Cited

U.S. PATENT DOCUMENTS

| 1,645,618 | 10/1927 | Nyquist .................... 324/57 DE |
| 2,751,429 | 6/1956 | Schlesinger ............... 324/57 DE |
| 2,970,258 | 1/1961 | Sinclair ..................... 324/57 DE |
| 2,971,086 | 2/1961 | Feijoo et al. ............... 324/83 Q |
| 3,281,679 | 10/1966 | Schafer ...................... 324/57 R |
| 3,913,011 | 10/1975 | Hughes et al. ............. 324/57 R |
| 3,970,926 | 7/1976 | Rigby et al. ............... 324/57 DE |
| 4,028,625 | 6/1977 | Behrend .................... 324/57 DE X |

Primary Examiner—Ernest F. Karlsen
Attorney, Agent, or Firm—Howard L. Rose

[57] ABSTRACT

A measure of delay distortion produced in a circuit under test is provided by applying a purely amplitude-modulated carrier to the circuit and detecting the resulting phase modulation.

20 Claims, 8 Drawing Figures

AM-PM CONVERSION FOR MEASURING DELAY DISTORTION

BACKGROUND OF THE INVENTION

The present invention relates to methods and apparatus for measuring group delay and group delay distortion in electrical communications systems.

Group delay is a desirable parameter to measure in communication systems. It represents the first derivative or rate of change of the phase shift versus frequency characteristic of the system. If group delay is flat (or constant) over the frequency spectrum of interest, then all frequencies are delayed by the same amount when passed through the system and there is no delay distortion. If, however, the group delay characteristic departs from a constant over one or more portions of the frequency spectrum, signals at those frequencies will experience delay distortion.

It is accepted in the art that group delay measurements require a reference signal at the measuring equipment which has a constant phase displacement relative to the test signal applied to the circuit or network under test. This would present no problem if an oscillator could be designed having an absolutely constant frequency. Since this is impractical, prior art approaches to group delay measurement have had to include transmission of a suitable reference signal from the test signal source. For example, in one prior art approach a separate reference channel is provided to transmit the test signal. This separate reference channel is undesirable for reasons of expense and complexity. An alternative prior art approach, described in U.S. Pat. Nos. 3,414,809 (Hoffmann et al) and 3,899,738 (Harzer), provides a transmitter having two carrier frequency oscillators, the signals from which are alternately applied to the circuit under test. Each carrier is amplitude-modulated by the same modulation signal which is then used to control the frequency of a local oscillator at the receiver. In order to identify which is the reference carrier and which is the test carrier, the reference carrier must be additionally modulated. The requirement for a reference carrier source and an identification modulation signal source at the transmitter, as well as the need for suitable processing signals therefor at the receiver, renders the equipment rather expensive.

It is therefore an object of the present invention to provide a method and apparatus for measuring group delay and group delay distortion without requiring a side channel reference signal or an alternate carrier transmittion.

Another approach to measuring group delay distortion is described in U.S. Pat. No. 2,877,409 to Jacobsen et al. This approach employs a repetitively swept carrier which is amplitude modulated and passed through the circuit under test. The modulation signal is then detected and applied to a phase detector in a phase lock loop. A voltage controlled oscillator in the loop is nominally at the modulation frequency and has its phase established by the loop to correspond to the mean phase of the detected modulation signal. Departures of the detected modulation signal from this mean phase are then displayed on a scope as a function of the swept carrier frequency to provide a plot of the group delay characteristic. This approach does eliminate the need for a side channel reference without requiring alternate carrier signals. Nevertheless, this approach has certain disadvantages. Specifically, circuitry is required to effect carrier sweeping. In addition, the carrier sweeping must be maintained at a constant rate in order to maintain calibration of the group delay signal; this requires precise circuitry in the carrier sweep circuit. Further, this approach does not permit measurement and study at a single carrier frequency because if sweeping is stopped the loop output signal goes to zero.

It is therefore a further object of the present invention to provide a method and apparatus for measuring group delay and group delay distortion wherein the test signal generator circuitry is relatively simple and wherein measurements and studies can be made at individual test signal frequencies.

SUMMARY OF THE INVENTION

The present invention derives from the realization that a purely amplitude modulated test signal, when subjected to delay distortion, experiences phase modulation. In addition, the ratio of the unintended modulation to the applied amplitude modulation is a measure of delay distortion. Accordingly, the present invention utilizes a purely amplitude modulated test signal which, after being passed through the circuit under test, is phase and amplitude demodulated. The demodulated amplitude (AM) and phase (PM) components are measured and their ratio AM/PM serves as a measure of delay distortion at that test signal frequency. Measurement of the AM/PM ratio at different frequencies across the frequency band of interest permits delay distortion to be plotted against frequency. As is well known, delay distortion can be integrated with respect to frequency to yield group delay.

In one embodiment, phase demodulation is obtained by means of a phase lock loop which operates at the test carrier frequency. The loop error signal is passed through a narrow bandpass filter centered at the modulation frequency so that the loop, in effect, serves as a carrier phase jitter meter looking at the modulation component.

In another embodiment, phase demodulation is effected by detecting the envelope of the received signal residing at the second harmonic of the modulation frequency. This approach relies on the recognition that delay distortion produces even order harmonic distortion in the envelope of the amplitude-modulated signal.

BRIEF DESCRIPTION OF THE DRAWINGS

The above and still further objects, features and advantages of the present invention will become apparent upon consideration of the following detailed description of one specific embodiment thereof, especially when taken in conjunction with the accompanying drawings, wherein.

DESCRIPTION OF PREFERRED EMBODIMENTS

The present invention is based on the principle that if a test signal has purely amplitude modulation (AM) and is subjected to delay distortion, it experiences phase modulation (PM); and further, that the phase modulation level is a proportional measure of the amount of delay distortion. To illustrate this mathematically, consider a test signal having a carrier frequency $\omega_c$ which is purely amplitude modulated by a modulation signal having a frequency $\omega_m$. If this signal is passed through a circuit under test, the resultant phase ($\phi$) versus frequency ($\omega$) characteristic may be represented by some polynominal which, in turn, can be represented by a Taylor series expanded about $\omega_c$ as follows:

$$\phi = \phi_c + a_1(\omega - \omega_c) + a_2(\omega - \omega_c)^2 + \epsilon(\omega - \omega_c) \tag{1}$$

wherein $\phi_c$ is the phase of the received carrier frequency, $a_1$ and $a_2$ are constants, and $\epsilon(\omega - \omega_c)$ represents higher order terms which can be neglected for purposes of the present analysis. Group delay, $\tau$, is defined as the first derivative of phase with respect to frequency. Differentiating expression (1) accordingly results in:

$$\tau = \frac{d\phi}{d\omega} = a_1 + 2a_2(\omega - \omega_c) \tag{2}$$

Delay distortion, in turn, is defined as the second derivative of phase with respect to frequency. Differentiating expression (2) accordingly, $$\frac{d\tau}{d\omega} = 2a_2 \tag{3}$$

Figures 1, 2, 3:
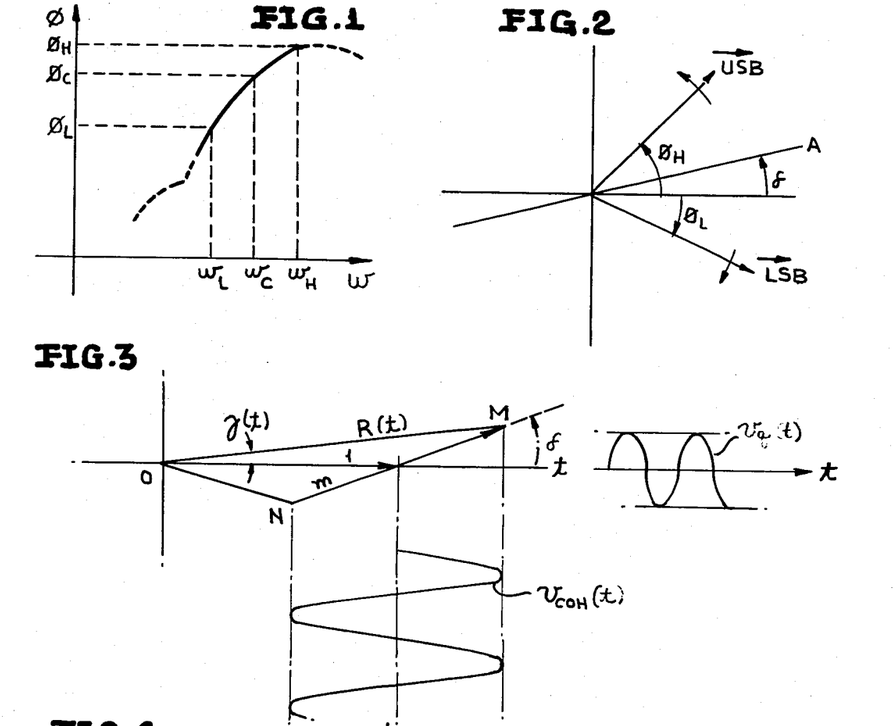
FIG. 1 is a plot of small portion of an arbitrary phase versus frequency characteristic.
FIG. 2 is a vectorial representation of a received amplitude modulated signal which has experienced delay distortion.
FIG. 3 is a vectorial representation versus time of the resultant vector of the two sidebands of FIG. 2, showing the resolution therefrom of two quadrature related components.

Referring to FIG. 1, there is illustrated a generalized curve representing a portion of the phase versus frequency plot of the received double sideband signal in expression (1) over the very small frequency range subsisting between the sidebands $\omega_c - \omega_m$ and $\omega_c + \omega_m$. It is noted that the lower sideband frequency ($\omega_c - \omega_m$) is designated as $\omega_L$, and that the corresponding phase at that frequency is designated $\phi_L$. Likewise the upper sideband frequency $\omega_c + \omega_m$ is designated $\omega_H$ and the corresponding phase is $\phi_H$. The phase at the carrier frequency $\omega_c$ is designated $\phi_c$. Substituting the different sets of co-ordinates of FIG. 1 into expression (1) yields:

$$\phi_c = \phi_c \tag{4}$$

$$\phi_L = \phi_c + a_1(\omega_L - \omega_c) + a_2(\omega_L - \omega_c)^2 \tag{5}$$

$$\phi_H = \phi_c + a_1(\omega_H - \omega_c) + a_2(\omega_H - \omega_c)^2 \tag{6}$$

Noting that $\omega_H - \omega_c = -(\omega_L - \omega_c) = \omega_m$, then subtracting expression (4) from each of expressions (5) and (6) yields:

$$\phi_L - \phi_c = -a_1\omega_m + a_2\omega_m^2 \tag{7}$$

and $$\phi_H - \phi_c = a_1\omega_m + a_2\omega_m^2 \tag{8}$$

To simplify the expression, let $\theta_H = \phi_H - \phi_c$ and $\theta_L = \phi_c - \phi_L$. Adding equations (7) and (8) yields:

$$\theta_H - \theta_L = 2a_2\omega_m^2 \tag{9}$$

Solving for $a_2$, $$a_2 = \frac{\theta_H - \theta_L}{2\omega_m^2} \tag{10}$$

Substituting this value of $a_2$ into the expression for delay distortion in equation (3), $$\frac{d\tau}{d\omega} = \frac{\theta_H - \theta_L}{\omega_m^2} \tag{11}$$

Therefore, if the quantity $$\frac{\theta_H - \theta_L}{\omega_m^2}$$

can be measured, we have a measure of delay distortion $$\frac{d\tau}{d\omega}$$

and this can be integrated with respect to frequency to obtain group delay $\tau$.

Putting the foregoing aside for a moment and considering the nature of the signals in the time domain, the purely amplitude-modulated transmitted signal $v_T(t)$ may be represented as follows:

$$v_T(t) = A(1 + m \cos[\omega_m t + \theta_m]) \cos(\omega_c t + \theta_c), \tag{12}$$

wherein A is a constant depending on amplitude, m is the modulation factor, $\theta_m$ is the phase of the modulation component, and $\theta_c$ is the phase of the carrier component. For simplicity it is assumed that there is negligible amplitude distortion and that $A = 1$, whereupon equation (12) can be represented as:

$$v_T(t) = \cos(\omega_c t + \theta_c) + \frac{m}{2}\cos[(\omega_c + \omega_m)t + \theta_m + \theta_c] + \frac{m}{2}\cos[(\omega_c - \omega_m)t + \theta_c - \theta_m] \tag{13}$$

Normalizing the phase relative to the carrier, $$v_T(t) = 1 + \frac{m}{2}\cos[\omega_m t + \theta_m] + \frac{m}{2}\cos[-\omega_m t - \theta_m] \tag{14}$$

Equation (14) corresponds to a colinear set of vectors in the same direction for $\omega_m t + \theta_m = -\omega_m t - \theta_m$; or otherwise stated, for $t = -\theta_m/\omega_m$. If the time origin is shifted in equation (14) by an amount to make $\theta_m = 0$, the result is:

$$V_T(t) = 1 + \frac{m}{2}\cos\omega_m t + \frac{m}{2}\cos(-\omega_m t). \tag{15}$$

If this signal is passed through a network wherein it experiences delay distortion (assuming negligible differential gain error), the received signal takes the form:

$$v_R(t) = 1 + \frac{m}{2} \cos(\omega_m t + \theta_H) + \frac{m}{2} \cos(-\omega_m t - \theta_L). \quad (16)$$

This expression is represented vectorially in FIG. 2 wherein the counterclockwise rotating upper sideband vector ($\overline{USB}$) subtends an angle $\theta_H$ and the clockwise rotating lower sideband vector ($\overline{LSB}$) subtends an angle $\theta_L$ at any time with respect to the carrier phase. The vector $\overline{OA}$ represents the colinear position of $\overline{USB}$ and $\overline{LSB}$. The sidebands are colinear and subtend angle $\delta$ relative to the carrier phase when, from equation (16):

$$\omega_m t + \theta_H = -\omega_m t - \theta_L + 2\pi n, \quad (17)$$

where n is any positive integer. Solving for t at that instant from equation (17), $$t = -\frac{(\theta_L + \theta_H)}{2\omega_m} + \frac{\pi n}{\omega_m} \quad (18)$$

Using this value of t in the expression for each sideband to give the phase angle of each sideband at their colinear position, $$\omega_m t + \theta_H = n\pi + \frac{\theta_H - \theta_L}{2} \quad (19)$$

and $$-(\omega_m t + \theta_L) = -n\pi + \frac{\theta_H - \theta_L}{2} \quad (20)$$

and since $\theta_H$ and $\theta_L$ are equi-distant from $\delta$, $$\delta = \frac{\theta_H - \theta_L}{2}. \quad (21)$$

However, this expression $$\frac{\theta_H - \theta_L}{2}$$

can be found, by rearranging terms in equation (11) to equal $$\frac{\theta_H - \theta_L}{2} = \left(\frac{d\tau}{d\omega}\right) \frac{\omega m^2}{2} = \delta \quad (22)$$

Solving from $$\frac{d\tau}{d\omega},$$

or delay distortion, $$\frac{d\tau}{d\omega} = \frac{2\delta}{\omega_m^2} \quad (23)$$

Thus, delay distortion is directly proportional to the phase displacement, $\delta$, of the resultant vector of the sidebands $\overline{USB}$ and $\overline{LSB}$. The magnitude of that vector is $m \sin \omega_m t$, so that a vectorial representation such as that of FIG. 3 may be used for the sidebands. Specifically, the resultant vector for the two sidebands R(t) varies in length from $\overline{OM}$ to $\overline{ON}$ at the frequency $\omega_m$, where MN has a magnitude 2 M and subtends an angle $\delta$ with respect to the carrier (shown with unity amplitude for simplicity). R(t) can be resolved into two quadrature-related components, namely $V_{COH}(t)$ and $V_q(t)$ where $$V_q(t) = m \sin \delta \sin \omega_m t, \quad (24)$$

and $$V_{COH}(t) = 1 + m \cos \delta \sin \omega_m t \quad (25)$$

These quadrature-related components can be used to determine the angle $\delta$, to wit:

$$\delta = \tan^{-1}\left[\frac{V_q(t)}{V_{COH}(t) - 1}\right] \quad (26)$$

Thus, if we can measure $V_q(t)$ and $V_{COH}(t)$, we can measure $\delta$, and then from equation (23) we can compute delay distortion. However $V_{COH}(t) - 1$ corresponds to amplitude modulation, which can readily be detected in the reserved signal, and $V_q(t)$ corresponds to phase modulation, which likewise is readily detected. Therefore, it is only necessary to detect any unwanted phase modulation, and also detect the intentional amplitude modulation, and then take the ratio of the two to provide a proportional measure of delay distortion. Integration of the delay distortion function with respect to frequency provides a measure of group delay. The following description relates to embodiments capable of providing these measurements.

Figure 4:
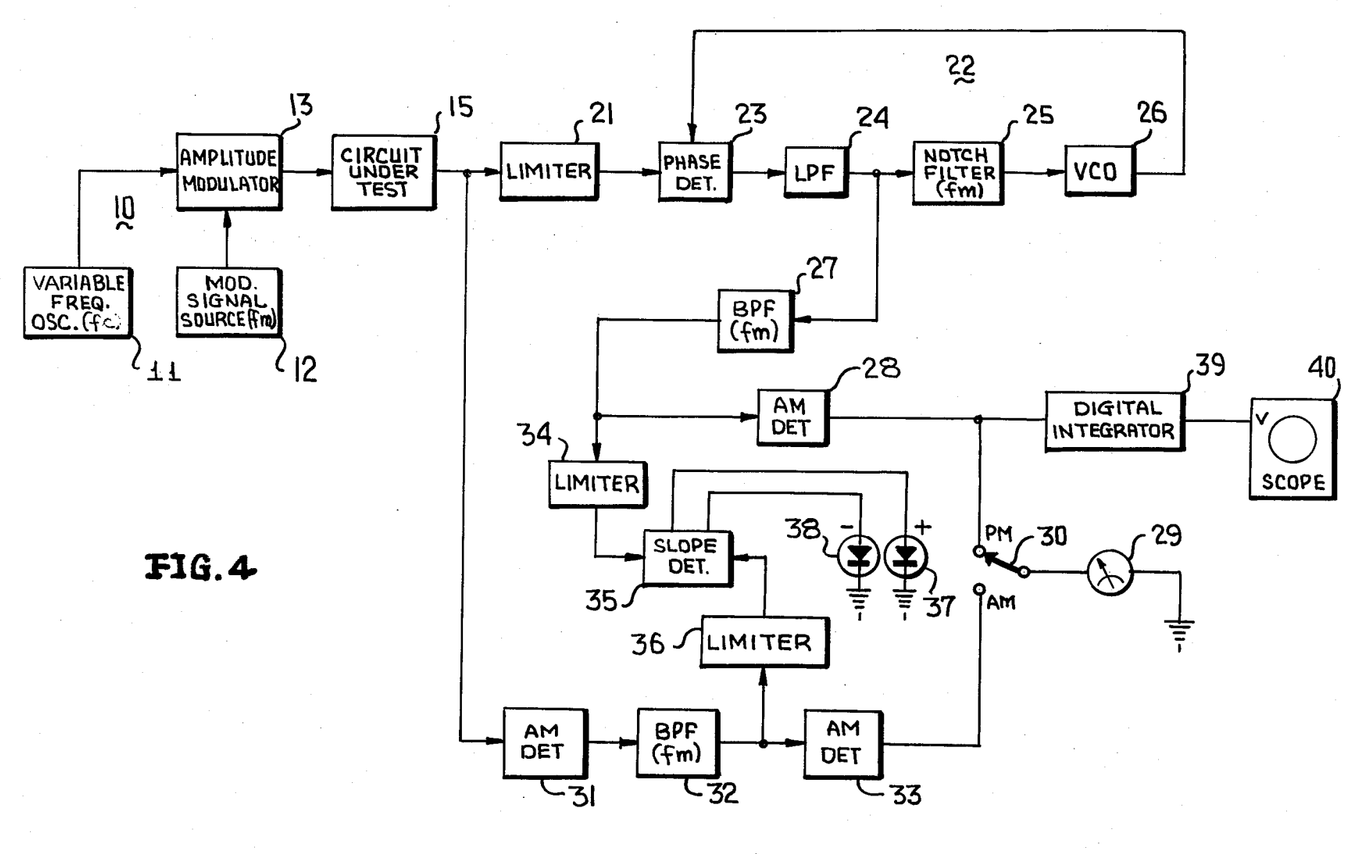
FIG. 4 is a block diagram of one embodiment of the present invention.

Referring specifically to FIG. 4 of the accompanying drawings, a transmitter 10 includes a variable frequency carrier oscillator 11 which provides a sinusoidal carrier signal at frequency $f_c$. For present purposes $f_c$ can be considered selectively variable between 200 Hz and 20 KHz; however, the principles of the present invention apply for substantially any range of carrier frequency. A source 12 of sinusoidal modulation at frequency $f_m$ is also provided at transmitter 10. For present purposes, to be consistent with current practice in measuring group delay, $f_m$ is 83⅓ Hz; however, $f_m$ can have substantially any value consistent with the principles of invention described herein. An amplitude modulator 13 serves to amplitude modulate the carrier signal ($f_c$) from oscillator 11 with the modulation signal ($f_m$). Importantly, the signal transmitted from transmitter 10 contains pure amplitude modulation with no phase modulation.

Reference numeral 15 designates a circuit network, or transmission path, to be tested for delay distortion experienced by signals passing therethrough at different carrier frequencies.

A receiver 20 is arranged to receive and process the amplitude modulated signals passed from transmitter 10 through circuit under test 15. The received signal is split between two paths. In a first path it passes through a limiter 21 to prevent variations in signal amplitude which might otherwise adversely affect signal processing. The amplitude-limited signal is then passed to a phase detector or comparator 23 which is part of a phase locked loop 22. Phase detector 23 compares the phase of the amplitude-limited received signal with a signal provided by voltage controlled oscillator (VCO) 26. The frequency of VCO 26 is variable, in response to an applied control voltage, over the range of carrier frequencies $f_c$ provided by oscillator 11 at transmitter 10. The control voltage for VCO 26 is derived from the output signal of phase detector 23 after that signal is passed through the loop filter 24 and a notch filter 25. Loop filter 24 is a low pass smoothing filter having a cut-off frequency selected in a conventional manner to provide the desired frequency response for phase locked loop 22. Specifically, the cut-off frequency of filter 24 must be selected to block any unwanted frequency components generated by the phase detector and to pass short term phase variations of interest. Notch filter 25 blocks the modulation frequency $f_m$, which normally resides below the cut-off frequency of low pass filter 24, so that only the effects of the carrier signal (and not the modulation signal) control loop 22.

The output signal from loop filter 24 is also applied to a narrow bandpass filter 27 tuned to the modulation frequency $f_m$. The signal from filter 27 is in turn passed to a detector 28 where it is smoothed to provide a signal suitable for application to a meter 29. The output signal of detector 28 is applied to meter 29 through single-pole double-throw meter switch 30 when the switch is in its PM position. Phase lock loop 22, bandpass filter 27 and detector 28, in effect, serve the same function as a phase jitter meter (see, for example, U.S. Pat. No. 3,711,773) which looks only at the jitter occurring in the modulation component, $f_m$. Importantly, however, loop 22 operates at the carrier frequency, $f_c$. This phase jitter or phase modulation measurement corresponds to the $V_q(t)$ term in equation (26), as described above.

The second path for the signal received by receiver 20 includes an amplitude modulation detector 31 and a bandpass filter 32 tuned to the modulation frequency $f_m$. Detector 31 and filter 32 combine to recover the amplitude modulation signal applied from source 12 at transmitter 10. This signal is then smoothed by detector 33 for meter readability purposes and applied to meter 29 via the AM position of meter switch 30. This AM component of the received signal corresponds to the $V_{COH}(t)$ component of equation (26), as described above. Thus, it is seen that $V_q(t)$ and $V_{COH}(t)$ are readily obtained by the circuit of FIG. 1 and that the angle $\delta$ can be readily determined from equation (26). This then permits delay distortion to be determined from equation (23). The computations required by equations (26) and (23) may be made manually, or they may be made automatically by means of circuitry to be described herein.

The output signal from bandpass filter 27 is also passed to a limiter 34 and then as one input signal to a slope detector circuit 35. Another input signal to slope detector 35 is derived from a limiter 36 which receives its input signal from bandpass filter 32. The amplitude modulation signal from limiter 36 clocks the slope detector circuit once during each period of the modulation signal $f_m$. The polarity of the phase modulation or jitter provided by limiter 34 at the clock time causes the slope detector 35 to energize either the +LED 37 of the −LED 38. The sign of the PM reading at meter 29 is therefore indicated by the LED's.

If desired, the detected phase modulation signal from detector 28 may be displayed on an oscilloscope 40 after integration by digital integrator 39.

The operation described above calls for computation of the angle $\delta$ and of delay distortion after the PM and AM components are measured at meter 29. It is noted, however, that the measured PM parameter, which corresponds to $V_q(t)$ in equation (26), is proportional to $\delta$ and that $\delta$, in turn, is proportional to delay distortion $\left(\frac{d\tau}{d\omega}\right)$.

Consequently, if the amplitude modulation at transmitter 10 is kept substantially constant, the PM measurement of itself provides a good relative indication of delay distortion. Thus, by measuring PM for various carrier frequencies ($f_c$) of interest, one can obtain a meaningful picture of delay distortion caused by circuit 15 across the spectrum.

Figure 5A:
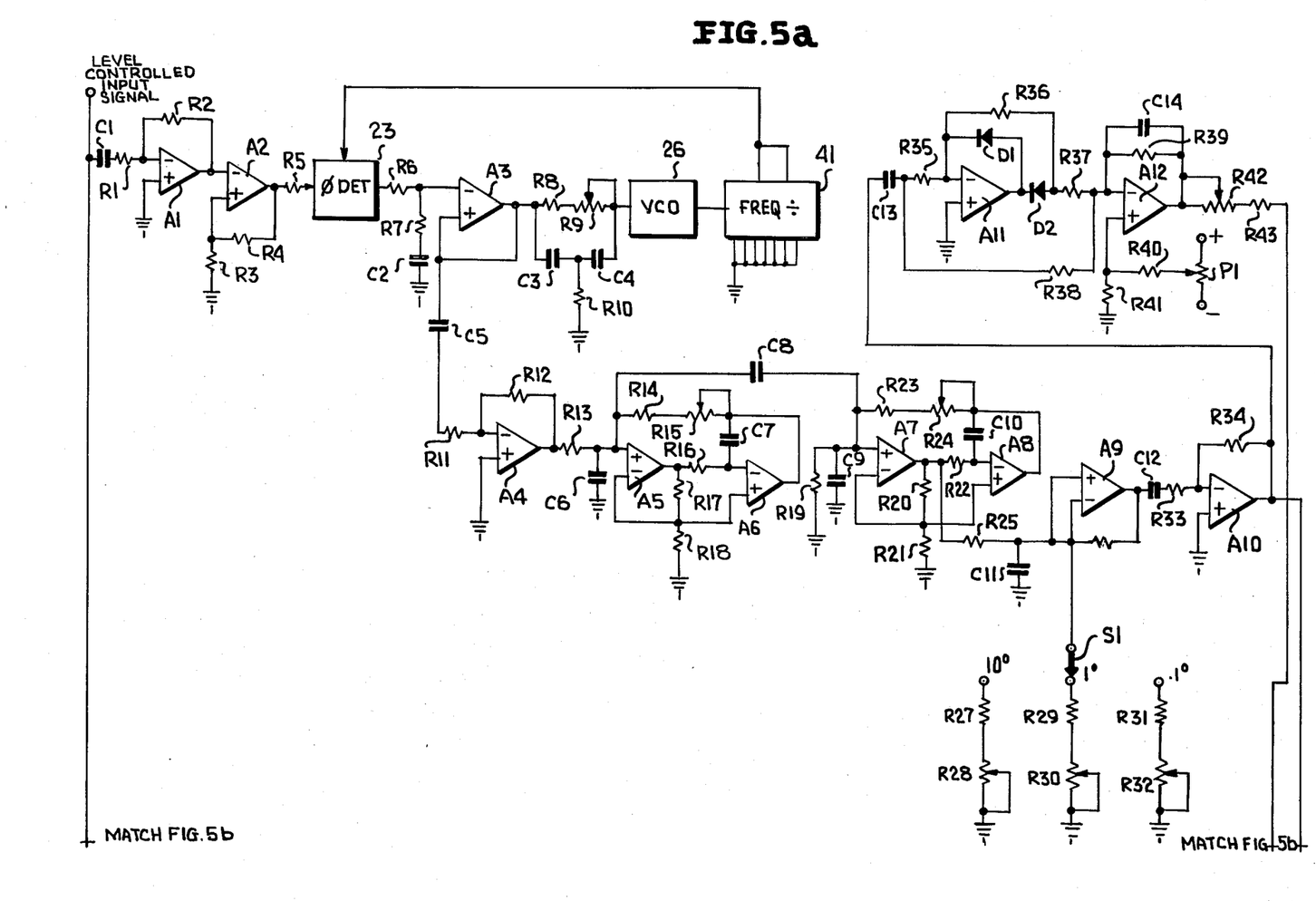
FIGS. 5a and 5b is a schematic diagram in detail of the embodiment of FIG. 4.
Figure 5B:
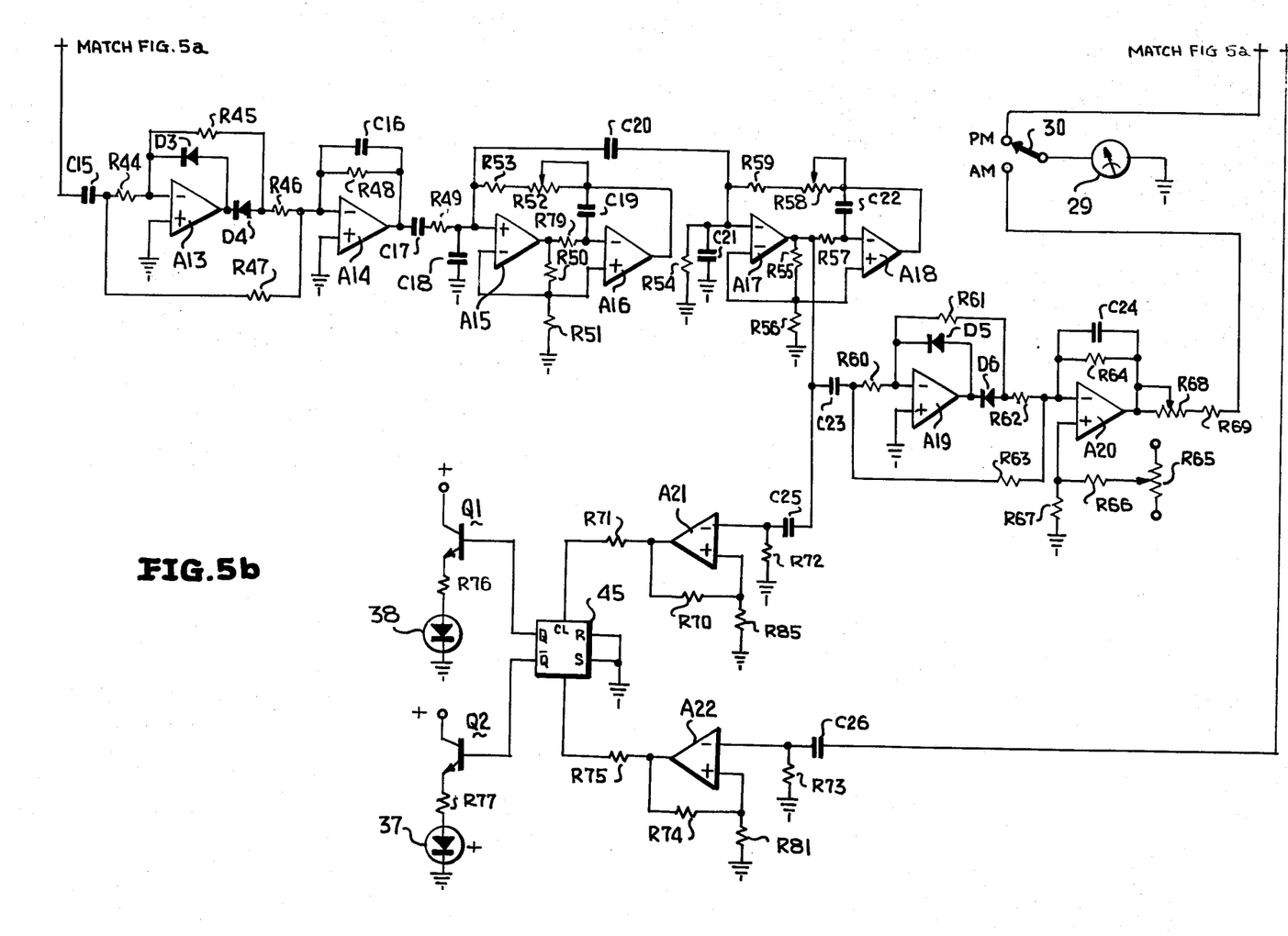

A schematic diagram of an actual embodiment, based on the receiver approach of FIG. 4 is illustrated in FIG. 5. Specifically, limiter 21 of FIG. 4 is made up of operational amplifiers A1 and A2 and corresponding resistors and capacitors. The received signal is ac-coupled through series-connected capacitor C1 and resistor R1 to the inverting input terminal of amplifier A1 which also includes a negative feedback resistor R2 and has its non-inverting input terminal grounded. The output signal from amplifier A1 is applied to the inverting input terminal of amplifier A2 which has its non-inverting input terminal resistively coupled to ground via R3. A feedback resistor R4 is connected between the output and inverting input terminals of amplifier A2.

The output signal from amplifier A2 is passed through resistor R5 to phase detector 23. The phase detector may be part of that which is commonly sold as model number CD 4046 by RCA Corporation. This model, as sold, includes two phase detectors (one of which is used as phase detector 23) and a voltage controlled oscillator (which may be used for VCO 26).

The output signal from phase detector 23 is passed through a resistor R6 to the non-inverting input terminal of operational amplifier A3, which terminal is also RC-coupled to ground via series connected resistor R7 and capacitor C2. Resistors R6 and R7 and capacitor C2 correspond to loop filter 24 of FIG. 4. Amplifier A3 has its output terminal coupled directly to its inverting input terminal and serves as a unity gain buffer amplifier to drive notch filter 25 and bandpass filter 27.

Notch filter 25 comprises a Bridged-T network including series-connected resistors R8 and R9, series-connected capacitors C3 and C4 connected in parallel with the series resistors, and a resistor R10 connected between the ground and the function of C3 and C4. Resistor R9 is adjustable to fine tune the notch filter which provides a null on the order of 10 dB at the modulation frequency $f_m$.

The notch filter output signal controls VCO 26 which has a nominal frequency at some multiple of the carrier frequency $f_c$. Consequently the VCO output signal is divided by the appropriate factor at frequency divider 41 and the frequency-divided signal is applied to phase detector 23.

The output signal from buffer amplifier A3 is a.c.-coupled via capacitor C5 and resistor R11 to the inverting input terminal of operational amplifier A4. This amplifier has its non-inverting input terminal grounded and includes a feedback resistor connected to the inverting input terminal. Amplifier A4 boosts the level of the loop error signal as needed for processing. In the particular arrangement shown, the amplifier has a nominal gain of ten. The amplified signal is passed to bandpass filter 27 which is tuned to the modulation frequency $f_m$ and includes two operational amplifiers A5 and A6.

These stages constitute one pole pair of a two-pole pair conventional Butterworth filter. More particular, the first stage includes resistor R13 connected in series between the output terminal of amplifier A4 and the non-inverting input terminal of amplifier A5. A capacitor C6 is connected between the non-inverting input terminal of A5 and ground. Connected to the inverting input terminal of A5 there is a negative feedback resistor R17, a grounded resistor R18, and a lead to the non-inverting input terminal of amplifier A6. A resistor R16 is connected between the output terminal of amplifier A5 and the inverting input terminal of amplifier A6. The output terminal of amplifier A6 is capacitively coupled to the inverting input terminal of that amplifier via capacitor C7, and is resistively coupled to the non-inverting input terminal of amplifier A5 via series connected resistor R14 and potentiometer R15. The second stage of the filter is identical in all respects to the first, with the following components corresponding in connection and value: A5 and A6 correspond to A7 and A8, respectively; R13, R14, R15, R16, R17 and R18 correspond to R19, R23, R25, R22, R20 and R21, respectively; and C6 and C7 correspond to capacitors C9 and C10, respectively. Connection between the two stages is via a capacitor C8 extending between the non-inverting input terminals of A5 and A7.

The output signal from the bandpass filter is taken from the output terminal of amplifier A7 and is fed through resistor R25 to the non-inverting input terminal of variable gain operational amplifier A9. A capacitor C11 is connected between the same terminal and ground. A negative feedback resistor R26 is connected between the output and inverting input terminals of amplifier A9. A resistive switching network is connected between the inverting input terminal and ground. The switching network includes a single-pole 3-position switch S1 having its arm connected to the inverting input terminal of A9. Each position includes a resistor (R27, R29 and R31, respectively) connected in series with a variable resistor (R28, R30 and R32, respectively) to ground. The values of these resistors are chosen to permit switch S1 to serve as a scale selector for meter 29 during PM measurements. Typically, the three switch positions correspond to 0.1°, 1.0° and 10° scales.

The output signal from variable gain amplifier A9 is passed through a capacitor C12 to a unity gain buffer amplifier comprising operational amplifier A10. Input resistor R33 conducts the signal from C12 to the inverting input terminal of A10; a negative feedback resistor R34 is connected between the amplifier output and inverting input terminals. The non-inverting input terminal of A10 is grounded.

The output signal from buffer amplifier A10 is applied to a circuit which includes two operational amplifiers A11 and A12 and which corresponds to AM detector 28 of FIG. 4. The signal is passed through series connected capacitor C13 and resistor R35 to the inverting input terminal of A11, the non-inverting input terminal of which is grounded. Two negative feedback paths are provided for amplifier A11. A first comprises diode D1 having its anode connected to the amplifier output terminal; the second includes diode D2 in series with resistor R36, the cathode of D2 being connected to the amplifier output terminal. The junction between diode D2 and resistor R35 is resistively coupled via R36 to the inverting input terminal of amplifier A12. A resistor R38 is connected between the inverting input terminal of A12 and the junction of C13 and R35. Negative feedback at amplifier A12 is provided by the parallel connected resistor R39, and capacitor C14. The non-inverting input terminal of A12 is connected to an adjustable bias circuit comprising resistors R40 and R41 and potentiometer P1. Specifically, opposite ends of the potentiometer are connected to different voltage levels and the wiper arm is connected to one side of R40. The other side of R40 is connected to the non-inverting input terminal of A12 and to R41 which is returned to ground. Amplifier A11 operates as a conventional full wave rectifier and amplifier A12 operates as a conventional integrator to provide a signal detection function which renders the demodulated phase modulation readable by a meter. The output signal is thus passed through a level adjustment resistor R42 and series resistor R43 to the PM contact of meter switch 30.

AM detector 31 of FIG. 4 has the same basic configuration as AM detector 28. Specifically, the following components find correspondence in circuit connections (although not necessarily component values): A13 and A14 correspond to A11 and A12, respectively; R44, R45, R46, R47 and R48 correspond to R35, R36, R37, R38 and R39, respectively; C15 and C16 correspond to C13 and C14, respectively; and diodes D1 and D2 correspond to diodes D3 and D4, respectively. The non-inverting input terminal of A14 is grounded rather than having an adjustable bias network connected thereto as does amplifier A12.

The output signal from amplifier A14 is applied via capacitor C17 to bandpass filter 32 (FIG. 4), a two-pole Butterworth filter identical in all respects to filter 27 and which is embodied by amplifiers A5, A6, A7 and A8 and associated circuitry. Specifically, the components of filter 32 find the following correspondence in the components of filter 27: amplifiers A15, A16, A17 and A18 correspond to amplifiers A5, A6, A7 and A8, respectively; resistors R49, R50, R51, R52, R53, R54, R55, R56, R57, R58, R59 and R79 correspond to R13, R17, R18, R15, R14, R19, R20, R21, R24, R23 and R16, respectively; and capacitors C18, C19, C20, C21 and C22 correspond to C6, C7, C8, C9 and C10, respectively.

The output signal from filter 32 is taken from the output terminal of amplifier A17 and applied to AM detector 33 (FIG. 4) which is embodied by amplifiers A19, A20 and associated circuitry. This detector corresponds in circuit connection to detector 23 in the following manner: Amplifiers A19 and A20 correspond to A11 and A12, respectively; resistors R60, R61, R62, R63, R64, R65, R66, R67, R68 and R69 correspond to R35, R36, R37, R38, R39, P1, R40, R41, R42 and R43, respectively; capacitors C23 and C24 correspond to C13 and C14, respectively; and diodes D5 and D6 correspond to diodes D1 and D2, respectively. The output signal from this detector is passed to the AM contact of meter switch 30.

Limiter 36 of FIG. 4 is represented by operational amplifier A21 and associated circuitry which is connected as a regenerative Schmitt trigger circuit. Specifically, the input signal to this circuit is derived from the output terminal of amplifier A17 in filter 32 and is coupled to the inverting input terminal of amplifier A21 by differentiator comprising capacitor C25 and resistor R72. A resistor R70 is connected between the output and non-inverting input terminals of A21, the non-inverting input terminal also being resistively coupled to ground via R80. The output signal from A21 is passed through resistor R71 to the clock input terminal CL of a clocked data flip flop 45 which serves the function of the slope detector 35 of FIG. 4. Limiter 34 corresponds to the circuit of operational amplifier A22 which is identical to that of amplifier A21, to wit: resistors R73, R74, R75 and R81 correspond to resistors R72, nary 1 Q signal which activates transistor Q1 and energizes LED 38. In this manner, the polarity of the phase modulation is readily indicated.

By way of an example only of one working embodiment of the circuit of FIG. 5, the following is a list of typical component values (for $f_m = 83\frac{1}{3}$ Hz):

| LIST | | | |
|---|---|---|---|
| R1, R2, R11, R17, R18, R20, R21, R25, R30, R50, R51, R55, R56, R72, R73 | 10KΩ | R33 | 4.99KΩ |
| | | R34, R38, R63 | 49.9KΩ |
| R3, R80, R81, | 100Ω | R35, R36, R44, R45, R60, R61 | 20KΩ |
| R4, R64, | 1MΩ | | |
| | | R37, R62 | 24.9Ω |
| R5 | 33KΩ | | |
| | | R39 | 499KΩ |
| R6 | 620KΩ | | |
| | | R46, R48 | 15.8KΩ |
| R7, R71, R75 | 30KΩ | | |
| | | R47 | 31.6KΩ |
| R8 | 348KΩ | | |
| | | R41, R67 | 301 Ω |
| R9, R12, R28, R42, P1, R43, R65, R68, R70, R74 | 100KΩ | R69 | 39.2KΩ |
| | | R76, R77 | 910 Ω |
| R10 | 90.9KΩ | | |
| | | C1, C12, C13, C15, C17, | |
| R13, R19, R49, R54 | 137KΩ | C23 | 22μF |
| R14, R23, R53, R59 | 14KΩ | | |
| | | C2, C11, C16 | 0.1μF |
| R15, R24, R52, R58 | 5KΩ | | |
| | | C3, C4 | .01μF |
| R16, R22, R57, R79 | 16.5KΩ | | |
| | | C5, C14, C25, C26 | 2.2μF |
| R26 | 200KΩ | | |
| | | C6, C9, C18, C21 | 0.47μF |
| R27, R40, R66 | 150KΩ | | |
| | | C7, C10, C19, C22 | .027μF |
| R29 | 8.06KΩ | | |
| | | C8, C20 | .013μF |
| R31 | 750 Ω | | |
| | | C24 | 1.0μF |
| R32 | 1KΩ | | |
| All operational amplifiers | | Raytheon Model 4558 | |

R70, R71 and R80, respectively; and capacitor C26 corresponds to C25. The input signal for this limiter is taken from the output terminal of amplifier A10. The output signal is applied to the data input terminal D of flip flop 45.

Flip Flop 45 has its set (S) and reset (R) input terminals grounded. The Q output signal is applied to the base of an NPN transistor switch Q1 which has its collector connected to a positive supply voltage and its emitter connected to the series combination of resistor 76 and LED 38 returned to ground. The $\bar{Q}$ output signal of flip flop 45 is applied to the base of an NPN transistor switch Q2 which has its collector connected to a positive supply voltage and its emitter connected to the series combination of resistor 77 and LED 37 returned to ground. The detected amplitude modulation signal from filter 32 (FIG. 4) triggers the Schmitt trigger associated with A21 at one zero-crossing per cycle of the modulation signal. Likewise, the detected phase modulation signal from filter 27 triggers the Schmitt trigger associated with A22 at one zero crossing per cycle of the modulation frequency ($f_m$) component of the detected phase modulation. If A21 is triggered on before A22, a binary 0 logic level is clocked into flip flop 45 when A21 triggers, resulting in the $\bar{Q}$ signal activating transistor Q2 to energize LED 37. If A22 is triggered on before A21, the binary one level from A22 is clocked into the flip flop when A21 triggers, resulting in a bi- It is assumed, although not specifically shown, that there is provided a suitable and conventional automatic gain control network in the circuitry of FIG. 5, prior to any processing, so that random changes in signal level do not adversely affect measurements.

Figure 6:
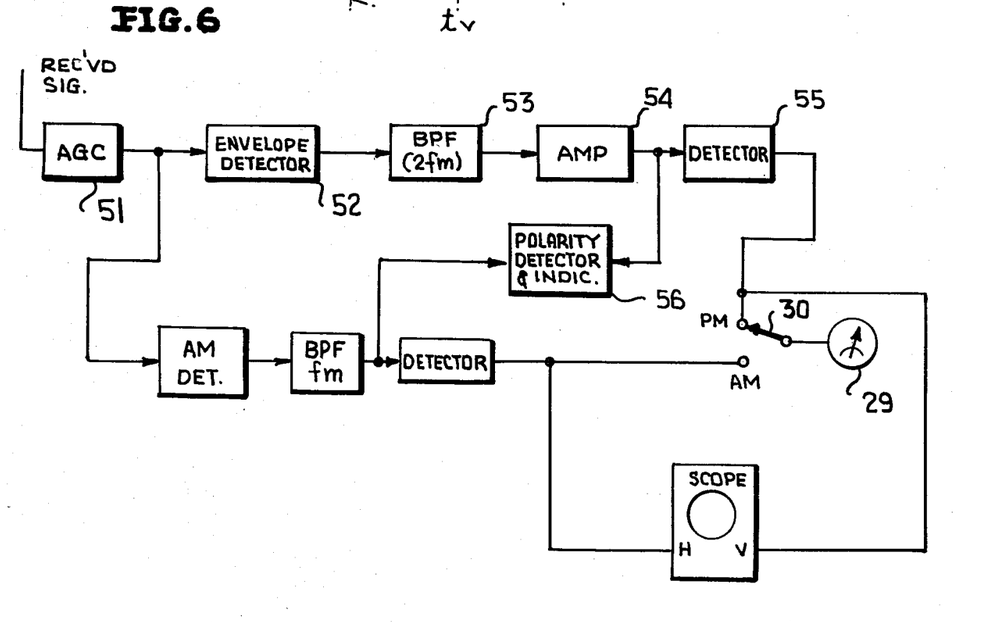
FIG. 6 is a block diagram of another embodiment of the invention.

FIG. 6 illustrates another embodiment of the receiver of the present invention. Specifically, it illustrates another approach to detecting unwanted phase modulation or jitter. The received amplitude modulated test signal with unintended phase modulation is passed through an automatic level control circuit to an envelope detector 52 which detects the amplitude modulation wave appearing on the carrier. Any phase distortion experienced by the signal in passing through the circuit under test is also present in this detected envelope signal. It can be demonstrated mathematically and empirically that delay distortion occurring in the envelope, due to unintended phase modulation, introduces even harmonic content into the envelope and further, that any components above the second harmonic are negligible. Therefore, measurement of the second order harmonic of the modulation frequency, $f_m$, provides a good approximation of the unwanted phase modulation introduced by the circuit under test. Accordingly, the detected envelope signal from detector 52 is passed through a bandpass filter 53 which is tuned to twice the modulation frequency, or $2f_m$. This second harmonic component is then amplified by amplifier 54 and smoothed by detector 55 before being passed to the PM contact of meter switch 30 for measurement at meter 29. The AM component of the signal is passed through AM detector 31, bandpass filter 32 and detector 33 as described in relation to FIG. 4. The polarity sensing circuit 56 corresponds to elements 34, 35 and 36 of FIG. 4. As also shown in FIG. 6, the detected PM component may also be measured on an oscilloscope.

Figure 7:
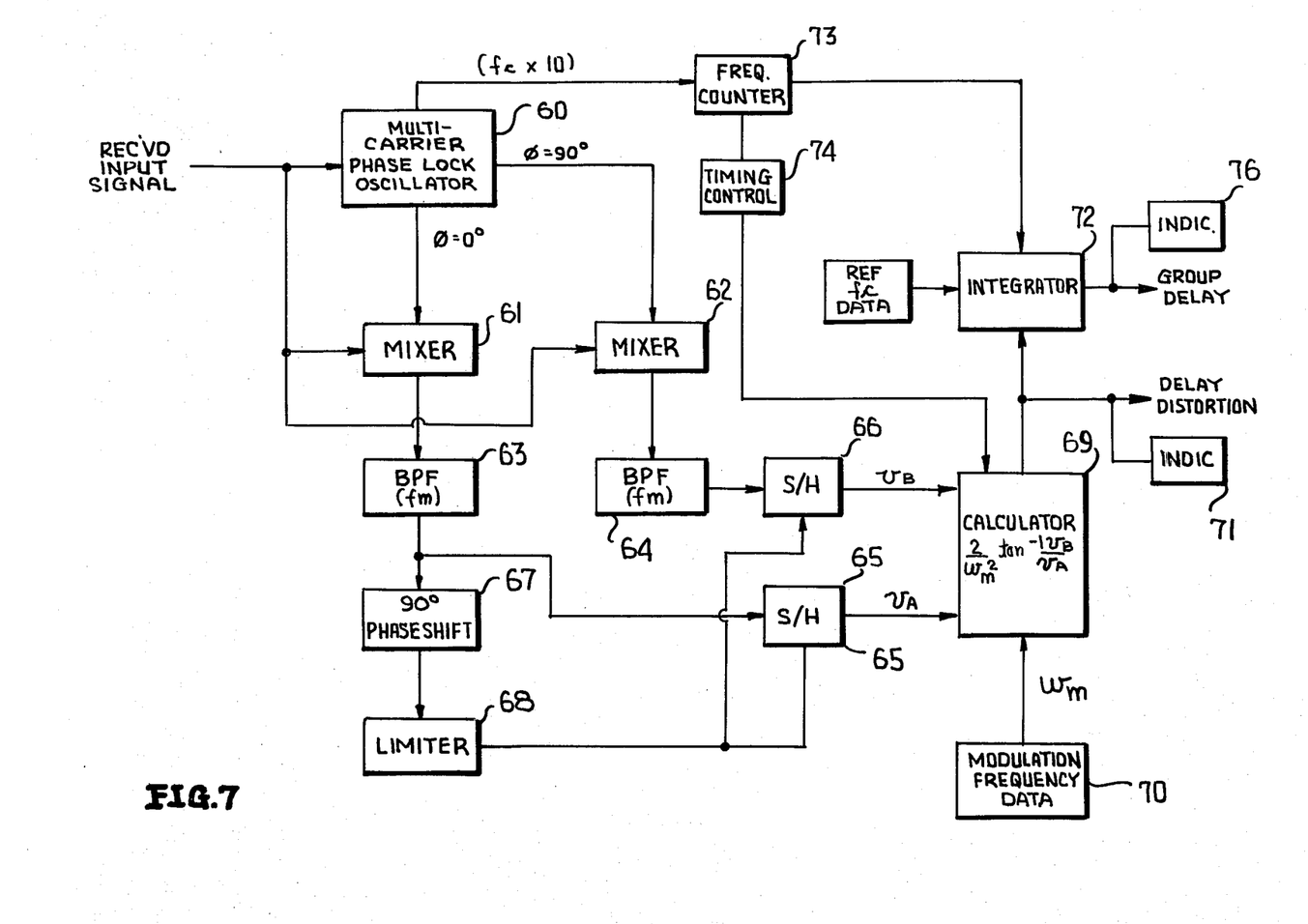
FIG. 7 is a block diagram of still another embodiment of the invention.

With respect to the embodiments described herein it will be appreciated by those in the art that automatic computation of delay distortion and group delay may easily be achieved. Specifically, the derived AM and PM signals may be fed to a minicomputer along with the modulation frequency to obtain $$\frac{d\tau}{d\omega} = \frac{2}{\omega_m^2} \tan^{-1} \frac{PM}{AM} \qquad (27)$$

which expression is derived from equations (23) and (26) with PM substituted for $V_q(t)$ and AM substituted for $V_{COH}(t)$. This expression can be readily integrated to obtain group delay. If desired, the measurement can be made remotely and detected amplitude and phase modulation can be applied to modulate a return carrier signal which is sent back to the transmitting station. Demodulation at the transmitting station permits computation there rather than at the remote location. An example of an automatic measuring arrangement is illustrated in FIG. 7.

Referring to FIG. 7, the received, level-controlled signal, which has been intentionally amplitude modulated and unintentionally phase modulated, is applied to a phase locked multi-carrier oscillator 60. Oscillator 60 may be phase locked in the manner described in relation to FIG. 4 and is arranged to provide two output signals separated in phase by ninety degrees and at the carrier frequency of the incoming signal. Each of the two phasal components are applied to respective mixers 61, 62 which also receive the incoming signal and serve to demodulate the modulation signal therefrom. Because of the 90° phase shift between the two signals from phase locked oscillator 60, the output signals from mixers 61, 62 are also separated in phase by 90°. These two signals are passed through respective bandpass filters 63, 64 which are tuned to the modulation frequency $f_m$. The filtered signals are, in turn, applied to respective sample and hold circuits 65, 66.

The signal from filter 63 is passed through a 90° phase shift circuit 67 and then to a limiter 68 which generates a train of sampling pulses at the modulation frequency $f_m$. These sampling pulses are applied simultaneously to sample and hold circuits 65, 66. The sample and hold circuits, therefore, take simultaneous samples of the two output signals from filters 63, 64. These filtered signals are quadrature-related signals which can be shown to approximate the detected amplitude and phase modulation, respectively, appearing on the received carrier signal (as described in U.S. Pat. No. 3,814,868 to Bradley). As such, these signals represent $V_{COH}(t)$ and $V_q(t)$ of equation (26); and the output signals $V_A$ and $V_B$ from sample hold circuits 65 and 66, respectively, represent sampled amplitudes of these signals.

The sampled levels $V_A$ and $V_B$ are applied to a computation circuit 69 which computes delay distortion according to equation (27). Specifically, computation circuit 69 also receives a level representing $\omega_m$ which, from example, can be selected at an adjustable modulation frequency data circuit 70. From the applied parameters, circuit 69 computes the value of $$\frac{2}{\omega_m^2} \tan^{-1} \frac{V_B}{V_A},$$

which corresponds to delay distortion. The computed value may be displayed on a meter, or the indicator, 71.

If a group delay measurement is desired, the delay distortion signal from computation circuit 69 may be applied to a digital integrator 72 which also receives data concerning the carrier frequency to which all group delay measurements are to be referenced. In addition, integrator 72 receives a signal representing the current carrier frequency from frequency counter 73 which in turn counts the frequency (fc×10) derived from multi-carrier phase lock oscillator 60. Timing to control the times of various data entries and shifts is effected by a timing control circuit 74.

The integration with respect to frequency carried out at integrator 72 results in a measure of group delay which can be applied to a meter or other indicator 76.

The essence of the present invention, whether computations are made automatically (as in FIG. 7) or manually (after measurement as per FIGS. 4 or 5), is the application of a pure amplitude modulation signal to a circuit under test and the detection of unwanted phase modulation, introduced by that circuit, as a measure of a delay distortion. This technique provides a straightforward approach to obtaining delay distortion and group delay without the need for a separate reference channel or an alternate reference transmission arrangement.

It should be pointed out that delay distortion may also be measured by transmitting a test signal to which pure phase modulation is applied and then monitoring unintended amplitude modulation at the receiving end as a measure of delay distortion. At the present time, however, it appears that simpler and more economical circuitry can be employed when pure AM is applied and PM is monitored.

While I have described and illustrated various specific embodiments of my invention, it will be clear that variations of the details of construction which are specifically illustrated and described may be resorted to without departing from the true spirit and scope of the invention as defined in the appended claims.

I claim:

1. A delay distortion measuring instrument comprising:
   means for passing an amplitude-modulated test signal through a circuit under test, said test signal being substantially devoid of phase modulation;
   means for phase demodulating said test signal to detect phase modulation introduced into said test signal by said circuit under test; and
   means for measuring delay distortion of said test signal as a function of the detected phase modulation.

2. The delay distortion measuring instrument according to claim 1, further comprising:
   means for detecting amplitude modulation appearing on said amplitude-modulated test signal after it is passed through said circuit under test; and
   means for measuring the detected amplitude modulation.

3. The delay distortion measuring instrument according to claims 1 or 2 wherein said means for measuring the detected phase modulation comprises:
  means for separating from the detected phase modulation a component at the modulation frequency of the amplitude modulation appearing on said test signal; and
  means for providing an indication of said component.

4. The delay distortion measuring instrument according to claim 3 wherein said means for detecting phase modulation comprises a phase lock loop including:
  voltage controlled oscillator means for providing a reference signal having a nominal frequency approximately equal to that of said test signal;
  phase detector means for comparing the phases of said test signal and said reference signal and for providing an error signal proportional to the phase difference;
  control means responsive to said error signal for controlling said voltage controlled oscillator to bring the phase of said reference signal closer toward the phase of said test signal;
  wherein said error signal corresponds to detected phase modulation introduced by said circuit under test.

5. The delay distortion measuring instrument according to claim 4:
  wherein said phase lock loop further includes as part of said control means, notch filter means for preventing any component of said error signal residing at said modulation frequency from controlling the phase of said voltage controlled oscillator; and
  wherein said means for separating comprise bandpass filter means for receiving said error signal and passing only that component of the error signal which is at said modulation frequency.

6. The delay distortion measuring instrument according to claims 1 or 2 wherein said means for detecting phase modulation comprises:
  means for envelope detecting the amplitude-modulated test signal passed by said circuit under test; and
  means for passing only that component of the detected envelope which is at twice the frequency of the amplitude modulation of said test signal.

7. The delay distortion measuring instrument according to claim 6 wherein said means for measuring detected phase modulation comprises means for measuring the amplitude envelope component at twice the amplitude modulation frequency.

8. The delay distortion measuring instrument according to claim 2 wherein said means for detecting phase modulation and said means for detecting amplitude modulation comprise:
  means for demodulating said test signal received from said circuit under test to provide two quadrature related signals at the modulation frequency of said amplitude modulation; and
  means for measuring the amplitudes of said two quadrature-related signals.

9. The delay distortion measuring instrument according to claim 8 further comprising means for computing the function $$\frac{2}{\omega_m^2} \tan^{-1} \frac{V_B}{V_A},$$

wherein
  $\omega_m$ is equal to $2\pi$ times said modulation frequency and $V_A$ and $V_B$ are the amplitudes of said quadrature-related signals.

10. The delay distortion measuring instrument according to claim 9 further comprising means for integrating said function with respect to frequency to obtain group delay.

11. The method for measuring delay distortion comprising the steps of:
  passing an amplitude-modulated test signal through a circuit under test, said test signal being substantially devoid of phase modulation;
  phase demodulating said test signal to detect phase modulation introduced into said test signal by said circuit under test; and
  measuring delay distortion of said test signal as a function of the detected phase modulation.

12. The method according to claim 11, further comprising the steps of:
  detecting amplitude modulation appearing on said amplitude-modulated test signal after it is passed through said circuit under test; and
  measuring the detected amplitude modulation.

13. The method according to claims 11 or 12 wherein said step of measuring the detected phase modulation comprises the steps of:
  separating from the detected phase modulation a component at the modulation frequency of the amplitude modulation appearing on said test signal; and
  providing an indication of said component.

14. The method according to claims 11 or 12 wherein said step of detecting phase modulation comprises the steps of:
  envelope detecting the amplitude-modulated test signal passed by said circuit under test; and
  passing only that component of the detected envelope which is at twice the frequency of the amplitude modulation of said test signal.

15. The delay distortion measuring instrument according to claim 14 wherein said step of measuring detected phase modulation comprises measuring the amplitude envelope component at twice the amplitude modulation frequency.

16. The method according to claim 12 wherein said step of detecting phase modulation and said step of detecting amplitude modulation include:
  demodulating said test signal received from said circuit under test to provide two quadrature related signals at the modulation frequency of said amplitude modulation; and
  measuring the amplitudes of said two quadrature-related signals.

17. The method according to claim 16 further comprising the step of computing the value $$\frac{2}{\omega_m^2} \tan^{-1} \frac{V_B}{V_A},$$

wherein
  $\omega_m$ is equal to $2\pi$ times said modulation frequency and $V_A$ and $V_B$ are the amplitudes of said quadrature-related signals.

18. A delay distortion measuring instrument comprising:
  means for generating a test signal;

means for modulating said test signal with a first modulation component such that the resultant modulation is purely by said first component and devoid of any modulation components orthogonally related to said first component;

means for passing the modulated test signal through a circuit under test;

means for demodulating said test signal to detect a modulation component introduced in said test signal by said circuit under test and orthogonally related to said first component; and means for measuring delay distortion of said test signal as a function of the detected modulation component.

19. The delay distortion measuring instrument according to claim 18 further comprising:

means for demodulating said test signal to detect said first modulation component appearing on said modulated test signal after it is passed through said circuit under test; and means for measuring the detected first modulation component.

20. The method of measuring delay distortion comprising the steps of:

generating a test signal;

modulating said test signal with a first modulation component such that the resultant modulation is purely by said first component and devoid of any modulation components orthogonally related to said first component;

passing the modulated test signal through a circuit under test;

demodulating said test signal to detect a modulation component introduced in said test signal by said circuit under test and orthogonally related to said first component; and measuring delay distortion of said test signal as a function of the detected modulation component.

* * * * *